United States Patent
Kurunczi et al.

(10) Patent No.: US 8,659,229 B2
(45) Date of Patent: Feb. 25, 2014

(54) PLASMA ATTENUATION FOR UNIFORMITY CONTROL

(75) Inventors: Peter Kurunczi, Cambridge, MA (US); Frank Sinclair, Quincy, MA (US); Costel Biloiu, Rockport, MA (US); Ludovic Godet, Boston, MA (US); Ernest Allen, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 91 days.

(21) Appl. No.: 13/108,052

(22) Filed: May 16, 2011

(65) Prior Publication Data

US 2012/0293070 A1    Nov. 22, 2012

(51) Int. Cl.
*H05H 1/24* (2006.01)

(52) U.S. Cl.
USPC .................................. 315/111.21; 315/111.41

(58) Field of Classification Search
None
See application file for complete search history.

(56) References Cited

U.S. PATENT DOCUMENTS

| | | | |
|---|---|---|---|
| 5,897,712 A | | 4/1999 | Hanawa et al. |
| 6,653,791 B1 * | | 11/2003 | Bailey et al. ............. 315/111.21 |
| 2002/0041160 A1 * | | 4/2002 | Barnes et al. ............ 315/111.21 |
| 2002/0125828 A1 * | | 9/2002 | Doi et al. ................. 315/111.21 |
| 2003/0193294 A1 | | 10/2003 | Wahlin |
| 2003/0232151 A1 | | 12/2003 | Vukovic |
| 2007/0113868 A1 * | | 5/2007 | Fu et al. ......................... 134/1.2 |
| 2007/0137576 A1 | | 6/2007 | Kurunczi et al. |
| 2008/0218086 A1 * | | 9/2008 | Sakai ....................... 315/111.21 |

FOREIGN PATENT DOCUMENTS

| WO | 0122465 A1 | 3/2001 |
|---|---|---|
| WO | 02084700 A1 | 10/2002 |
| WO | 2011022612 A2 | 2/2011 |

* cited by examiner

*Primary Examiner* — Crystal L Hammond

(57) ABSTRACT

A plasma processing apparatus and method are disclosed which create a uniform plasma within an enclosure. In one embodiment, a conductive or ferrite material is used to influence a section of the antenna, where a section is made up of portions of multiple coiled segments. In another embodiment, a ferrite material is used to influence a portion of the antenna. In another embodiment, plasma uniformity is improved by modifying the internal shape and volume of the enclosure.

18 Claims, 14 Drawing Sheets

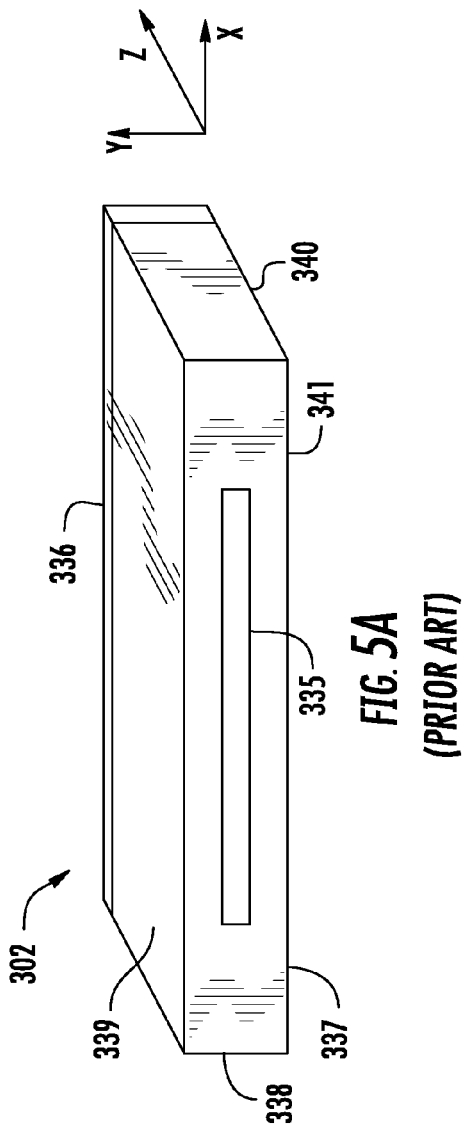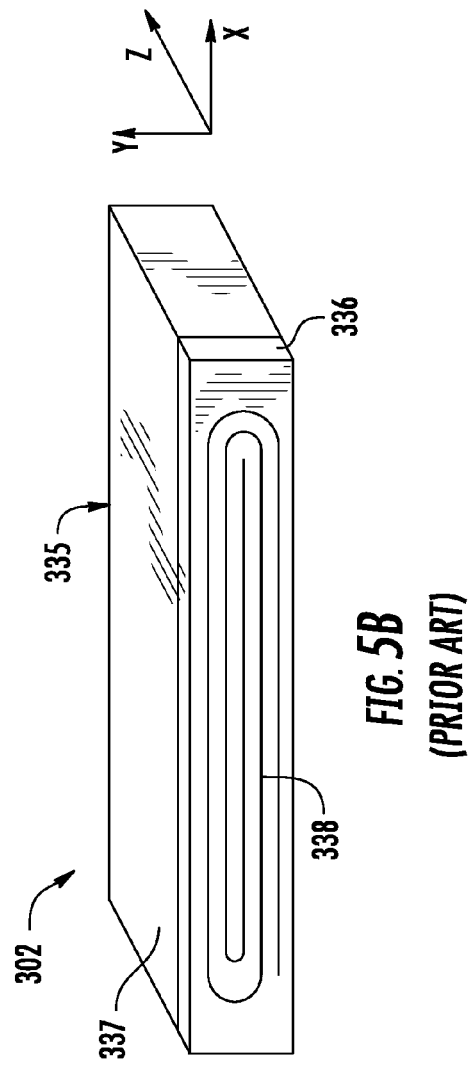
FIG. 5A (PRIOR ART)
FIG. 5B (PRIOR ART)

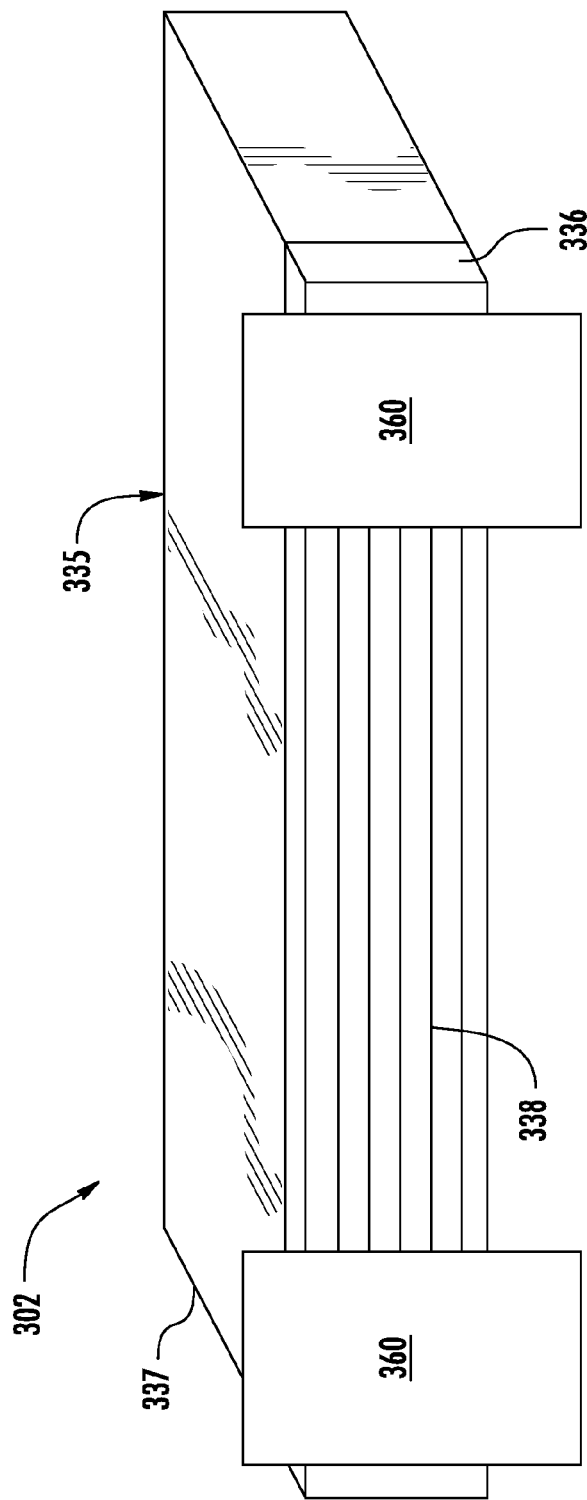

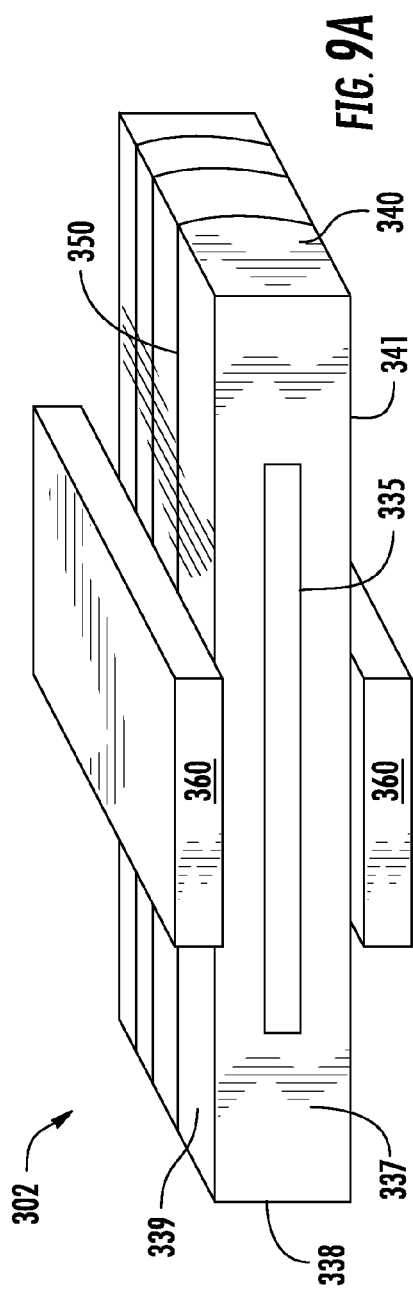
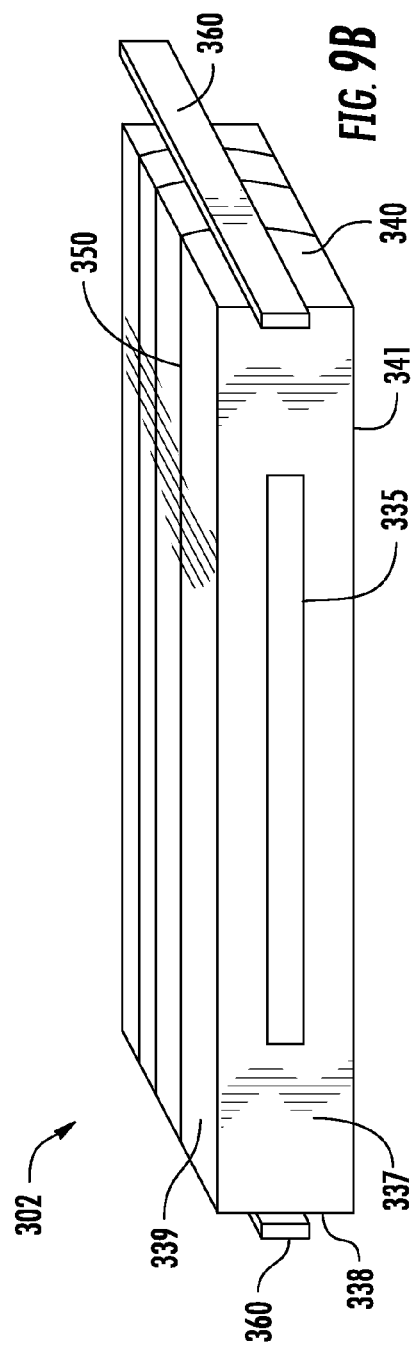

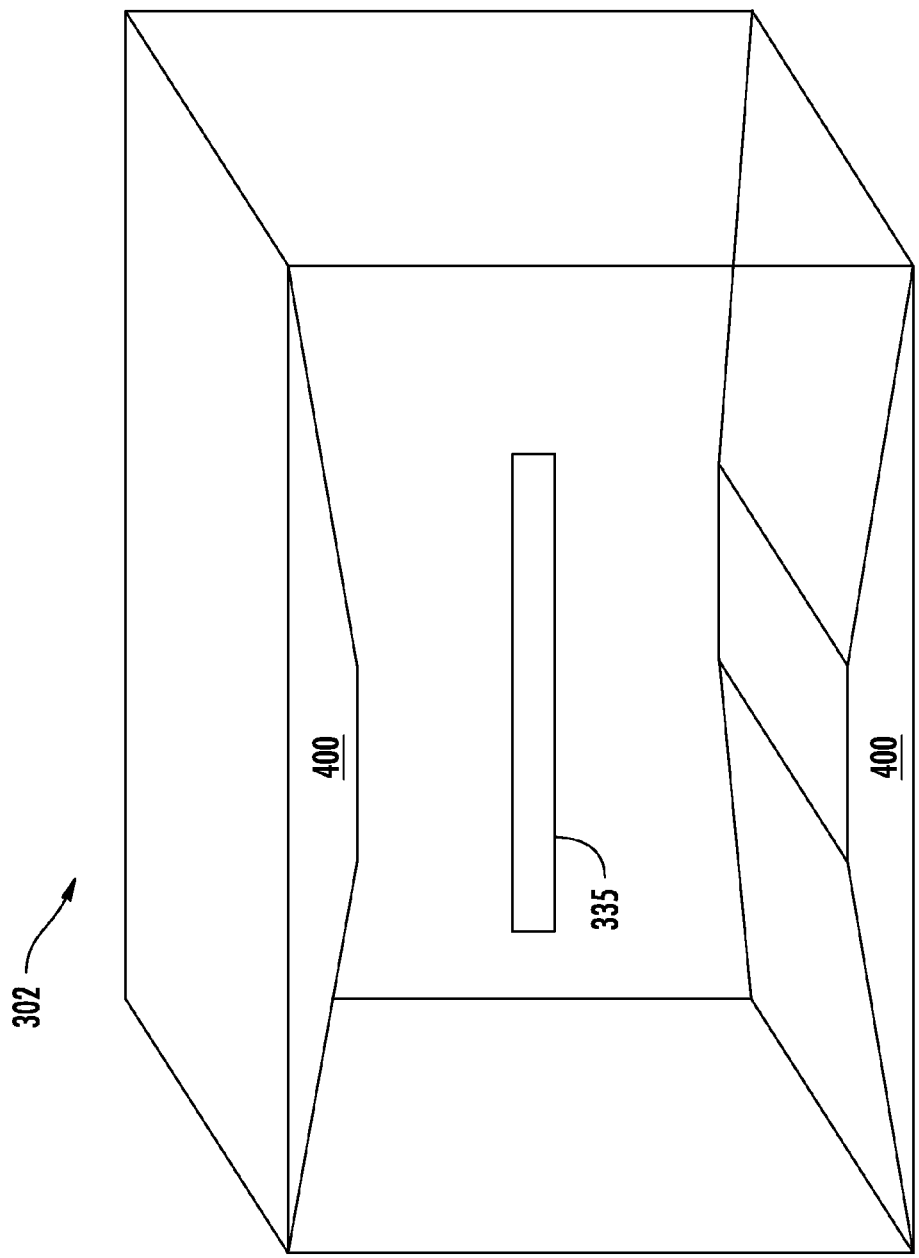

PLASMA ATTENUATION FOR UNIFORMITY CONTROL

BACKGROUND

A plasma processing apparatus generates a plasma in a chamber which can be used to treat a workpiece supported by a platen in a process chamber. In some embodiments, the chamber in which the plasma is generated is the process chamber. Such plasma processing apparatus may include, but not be limited to, doping systems, etching systems, and deposition systems. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

In other embodiments, the plasma may be generated in one chamber, which ions are extracted from, and the workpiece is treated in a different process chamber. One example of such a configuration may be a beam line ion implanter where the ion source utilizes an inductively coupled plasma (ICP) source. The plasma is generally a quasi-neutral collection of ions (usually having a positive charge) and electrons (having a negative charge). The plasma has an electric field of about 0 volts per centimeter in the bulk of the plasma.

Turning to FIG. 1, a block diagram of one exemplary plasma doping apparatus 100 is illustrated. The plasma doping apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma doping apparatus 100 may further includes a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma doping apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

In some embodiments, the planar and helical antennas 126, 146 comprise a conductive material wound in a spiraling pattern. For example, FIG. 2A shows one embodiment of a traditional planar antenna 126, while FIG. 2B shows a second embodiment. FIG. 3 shows a traditional helical antenna 146.

The plasma doping apparatus may also include a bias power supply 190 electrically coupled to the platen 134. The plasma doping system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma doping apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy.

One drawback of conventional plasma processing is lack of plasma uniformity. In some embodiments, the plasma concentration is greater in a portion of the process chamber, thereby causing unequal implantation of ions. To overcome this, it has been suggested to add a conductive body near the antenna 126, 146. Note in FIGS. 2 and 3, the antenna can be viewed as a set of connected nearly circular coiled segments, where the first end of a first coiled segment is connected to the second end of an adjacent coiled segment. For example, both FIG. 2A and FIG. 2B can be seen to have 4 connected coiled segments. In the case of FIG. 2A, the shape of each coiled segment 201 is slightly irregular such that the second end of a coiled segment 201 does not meet the first end of that coiled segment. Thus, one end of coiled segment 201*a* connects to an end of coiled segment 201*b*. In contrast, the coiled segments 202 of FIG. 2B are circular, however, there is a break such that the two ends of the coiled segments 202 do not connect. In this case, a linear segment 203 is used to connect two adjacent coiled segments 202. For example, linear segment 203*a* is used to connect coiled segment 202*d* and coiled segment 202*c*.

FIG. 3 shows a helical antenna 146. The wound coiled segments 204 of a helical antenna 146 can be attached using the mechanisms shown in FIG. 2A-B for planar antennas. To improve the plasma uniformity of a chamber utilizing such an antenna, it has been suggested to add a conductive body near one of more coiled segments of the antenna. In other words, referring to FIG. 2A, a metal object may be shaped and located so as to affect coiled segment 201d, without little or no impact on the other coiled segments. Stated another way, the conductive body is symmetrical in the radial direction (assuming a polar coordinate system where the origin is the center of the antenna as shown in FIGS. 2A-B). The metal object may be circular or annular. For example, an annular metal body may be used to affect coiled segment 201a, without affecting coiled segments 201b-d.

FIG. 4 shows a block diagram of a conventional ion implanter 300. Of course, many different ion implanters may be used. The conventional ion implanter may comprise an ion source 302 that may be biased by a power supply 301. The system may be controlled by controller 320. The operator communicates with the controller 320 via user interface system 322. The ion source 302 is typically contained in a vacuum chamber known as a source housing (not shown). The ion implanter system 300 may also comprise a series of beam-line components through which ions 10 pass. The series of beam-line components may include, for example, extraction electrodes 304, a 90° magnet analyzer 306, a first deceleration (D1) stage 308, a 70° magnet collimator 310, and a second deceleration (D2) stage 312. Much like a series of optical lenses that manipulate a light beam, the beam-line components can manipulate and focus the ion beam 10 before steering it towards a workpiece or wafer 314, which is disposed on a workpiece support 316.

In operation, a workpiece handling robot (not shown) disposes the workpiece 314 on the workpiece support 316 that can be moved in one or more dimensions (e.g., translate, rotate, and tilt) by an apparatus, sometimes referred to as a "roplat" (not shown). Meanwhile, ions are generated in the ion source 302 and extracted by the extraction electrodes 304. The extracted ions 10 travel in a beam-like state along the beam-line components and implanted on the workpiece 314. After implanting ions is completed, the workpiece handling robot may remove the workpiece 314 from the workpiece support 316 and from the ion implanter 300.

The ion source 302 may be an inductively coupled plasma (ICP) ion source. In some embodiments, such as in FIGS. 5A-B, the ion source 302 may comprise a rectangular enclosure, having an extraction slit 335 on one side 337. In certain embodiments, the side 336 opposite the extraction slit 335 may be made of a dielectric material, such as alumina, such that a planar antenna 338 may be placed against the dielectric wall 336 to create a plasma within the enclosure 302. The enclosure 302 also has a top surface 339, a bottom surface 341, and two endwalls 338, 340.

In another embodiment, a helical antenna 350 is wrapped around the endwalls 338, 340 and the top surface 339 and bottom surface 341 of the ICP ion source 302, as shown in FIG. 6.

In these embodiments, due to the irregular shape of the ion source 302, it is difficult to create a uniform plasma which can be extracted through the extraction slit 335. Accordingly, there is a need for a plasma processing method that overcomes the above-described inadequacies and shortcomings.

SUMMARY

A plasma processing apparatus and method are disclosed which create a uniform plasma within an enclosure. In one embodiment, a conductive or ferrite material is used to influence a section of the antenna, where a section is made up of portions of multiple coiled segments. In another embodiment, a ferrite material is used to influence a portion of the antenna. In another embodiment, plasma uniformity is improved by modifying the internal shape and volume of the enclosure.

BRIEF DESCRIPTION OF THE DRAWINGS

For a better understanding of the present disclosure, reference is made to the accompanying drawings, in which like elements are referenced with like numerals, and in which:

FIG. 5A is a front view of one embodiment of an ICP source;

FIG. 5B is a rear view of the embodiment of FIG. 5A;

FIG. 8C illustrates a first embodiment to correct the non-uniformity of FIG. 8A;

FIG. 9A illustrates a second embodiment to correct the non-uniformity of FIG. 7A;

FIG. 9B illustrates a second embodiment to correct the non-uniformity of FIG. 8A;

FIG. 11 illustrates a fifth embodiment to correct the non-uniformity of FIG. 7A.

DETAILED DESCRIPTION

Figure 1:
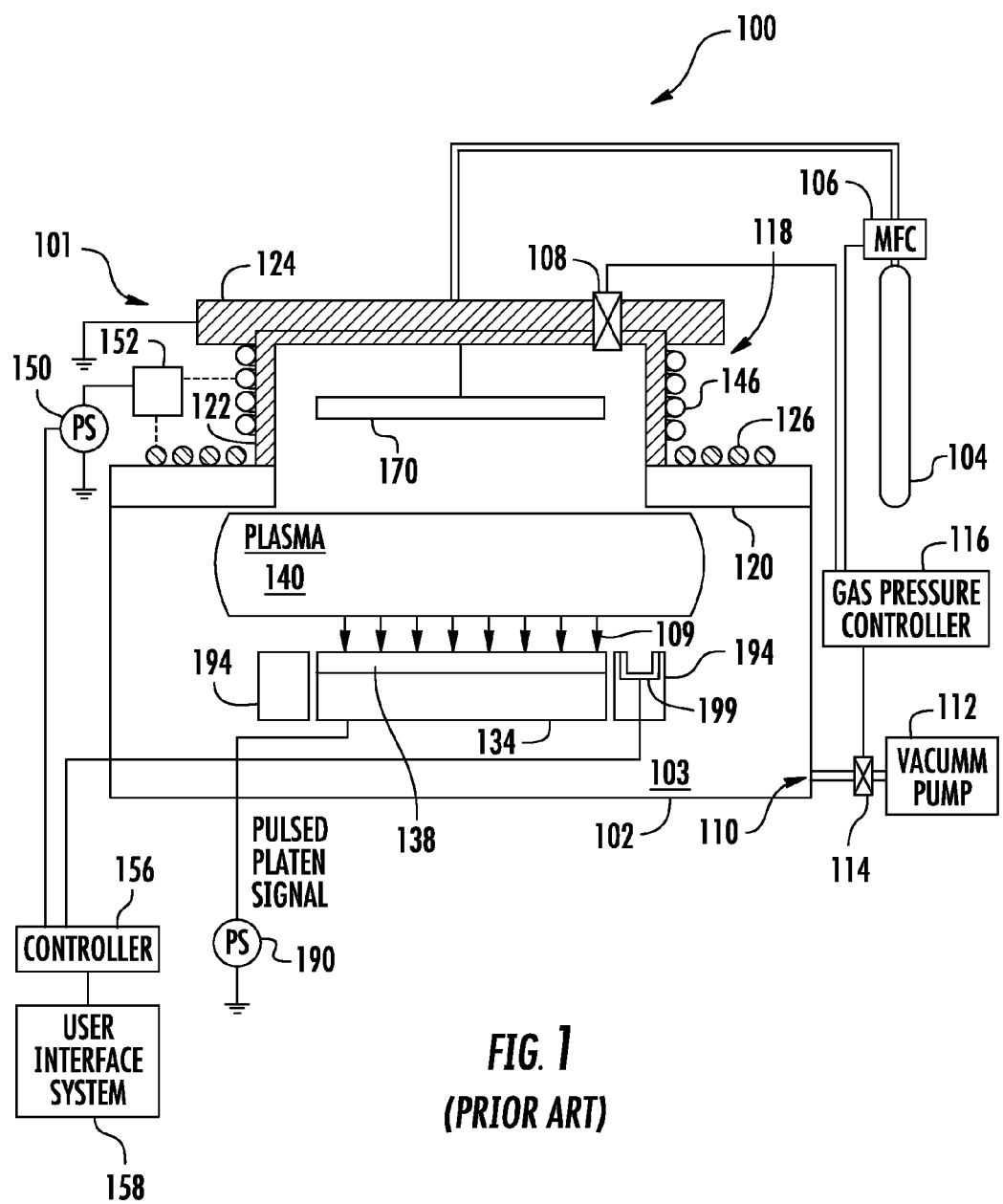
FIG. 1 is a block diagram of a plasma doping apparatus of the prior art.
Figure 2A:
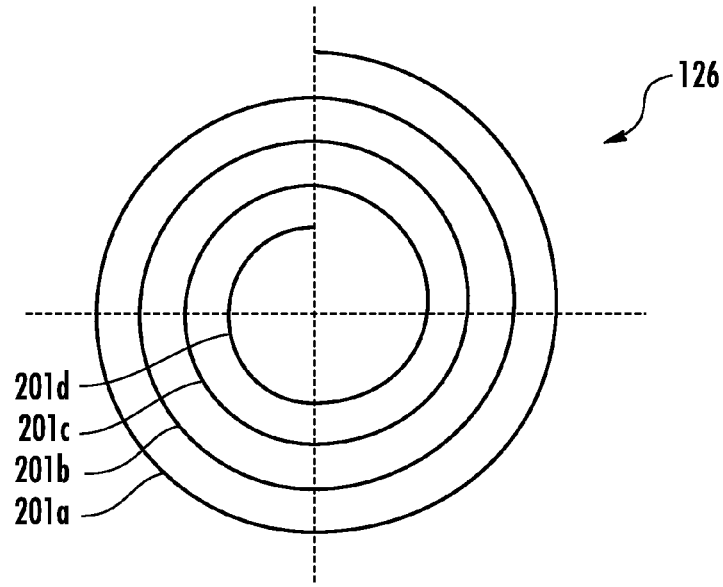
FIGS. 2A-B illustrate planar antenna of the prior art.
Figure 2B:
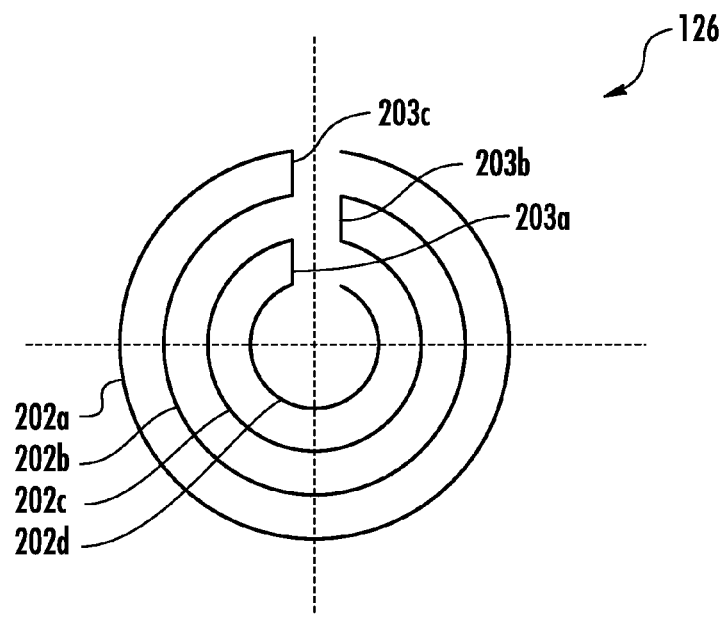
Figure 3:
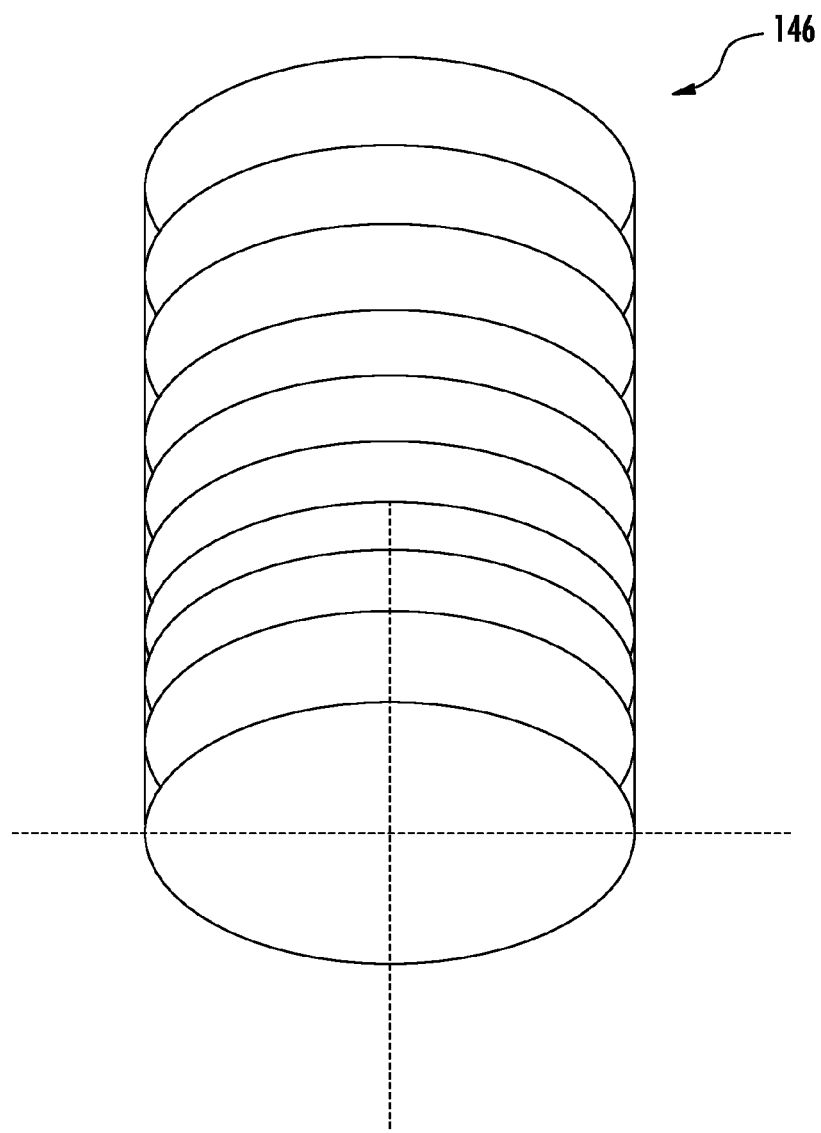
FIG. 3 illustrates a helical antenna of the prior art.
Figure 4:
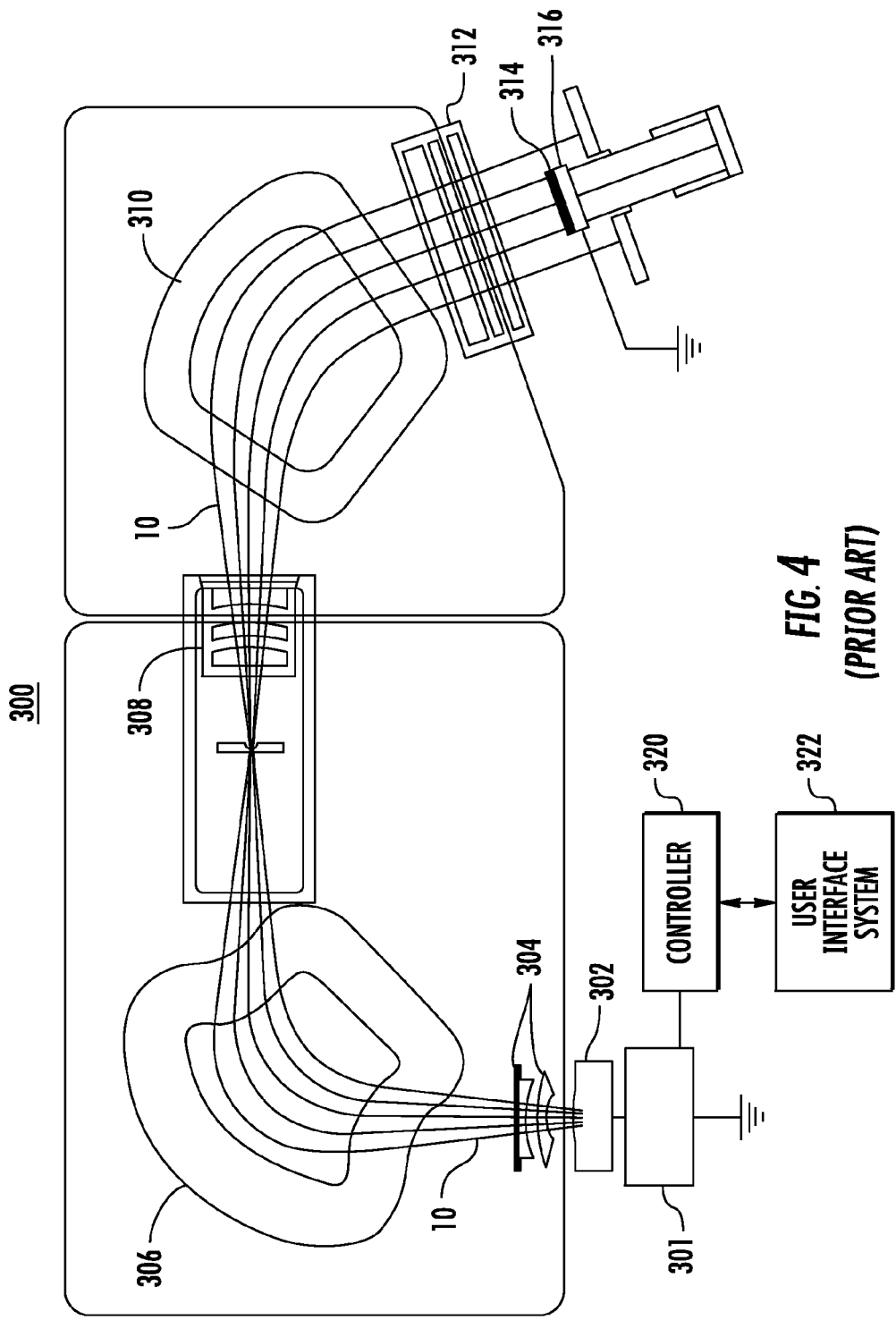
FIG. 4 is a block diagram of a ion implantation apparatus.
Figure 6:
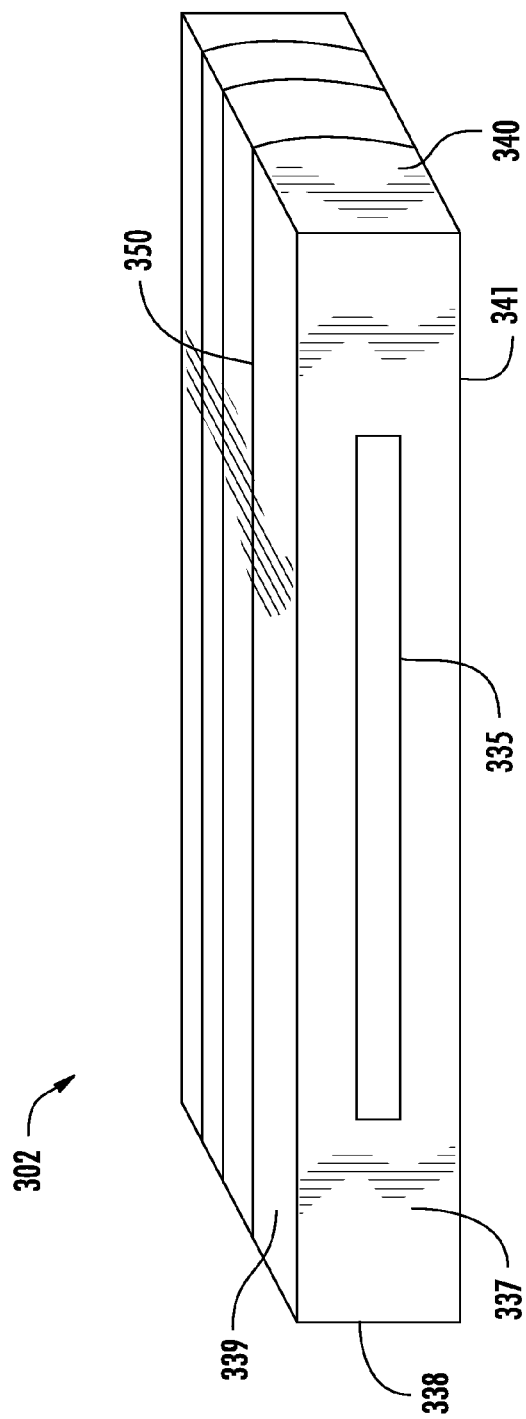
FIG. 6 is a front view of a second embodiment of an ICP source.

As described above, traditional ICP ion sources typically produce a plasma which is non-uniform in density. This problem is compounded when a non-symmetric enclosure (such as a rectangular enclosure) is used. FIGS. 5-6 show several embodiments of rectangular enclosures that may be used by inductively coupling energy to a plasma. This inductive coupling can be attenuated by placing a material that will dissipate energy through either eddy and/or hysteresis losses. Depending on the material used, either or both losses may be made to occur. For example, copper and aluminum will result in eddy losses alone, a non conductive ferrite will result in only hysteresis losses, and a magnetic steel will result in both eddy and hysteresis losses. Therefore, the term "attenuating materials" refer to both conductive materials and ferromagnetic materials. By selectively placing an RF attenuating material near a portion of the antenna for an ICP source, it is possible to control uniformity. In addition to the material's shape and composition, the magnitude of the attenuation can be controlled by adjusting the distance between the attenuating material and the antenna. To do so, the attenuating material 360 is moved in a direction perpendicular to the plane of the antenna. For example, in FIG. 7C, the attenuating material 360 is moved in the z direction. In FIG. 9A, the attenuating material 360 is moved in the y direction. In FIG. 9B, the attenuating material 360 is moved in the x direction.

Figure 7A:
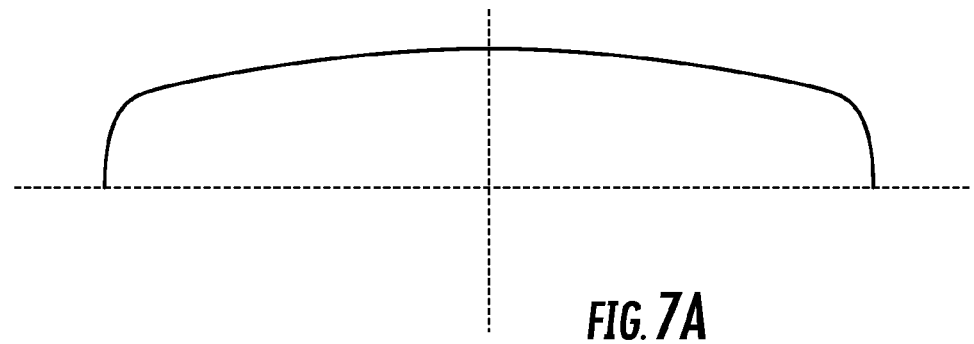
FIG. 7A illustrates one example of plasma non-uniformity.
Figure 7B:
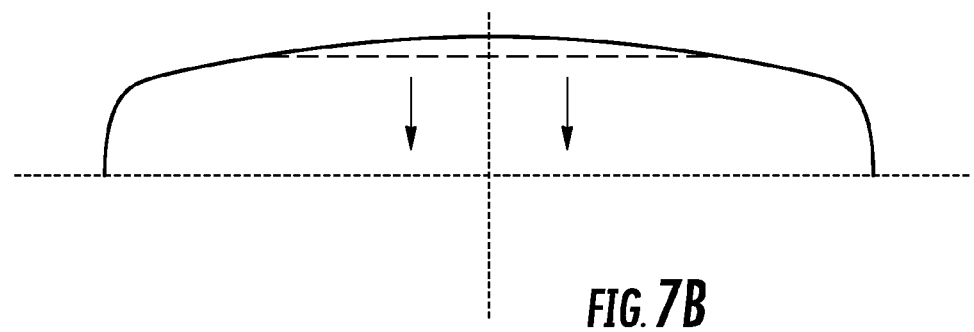
FIG. 7B illustrates the corrective action required for FIG. 7A.
Figure 7C:
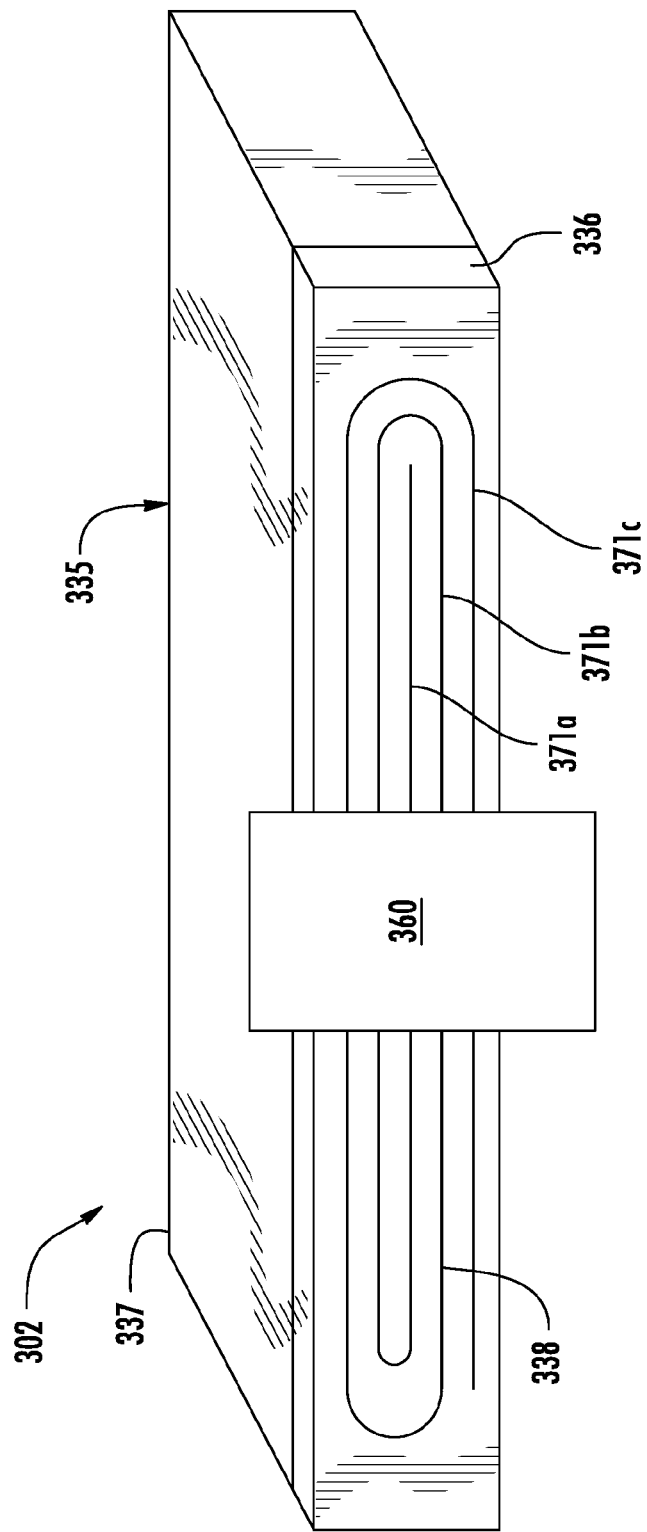
FIG. 7C illustrates a first embodiment to correct the non-uniformity of FIG. 7A.

In some embodiments, the plasma density created by the rectangular ICP source of FIG. 5 may be greater near the volumetric center of the enclosure. FIG. 5 shows an enclosure with a planar antenna, having a length, a width, and a depth, where length is defined as the direction parallel to the extraction slit 335. The length is also referred to as the x dimension, while the width and depth are referred to as the y and z dimensions, respectively. FIG. 7A shows a graph of the plasma density as a function of x-axis position, where the origin indicates the center of the extraction slit 335. As shown in the graph, the plasma density is greatest at the center and decays as one moves from the center toward the endwalls 338, 340. To correct this, it would be advantageous to reduce the density at the center, so as to be closer to the rest of the enclosure 302, as shown in FIG. 7B. To achieve this effect, an attenuating material 360 may be placed near the antenna 338 in the region which is to be attenuated. FIG. 7C shows an attenuating material 360 placed over antenna 338 in the center of the enclosure 302. Note that the attenuating material 360 covers the antenna 338 in the y dimension, but covers only a portion of each coiled segment in the x dimension. In other words, unlike prior art embodiments, the coiled segments are partially exposed, and partially covered. The choice of attenuating material 360 may be a conductive material, such as copper; a ferrite, or a combination having both properties, such as steel. The term "covered" as used in this disclosure is not intended to mean that the attenuating material literally covers the antenna. Rather, the term is defined as the attenuating material having the same x and y coordinates (for a planar antenna) as the antenna, while a different z coordinate. For helical antenna, the term refers to the same x, z coordinates for FIG. 9A and the same y,z coordinates for FIG. 9B.

In addition to being able to select a portion of the plasma density to attenuate through the use of an attenuating material, the amount of attenuation can also be controlled. As the attenuating material 360 is moved further from the antenna 338, its ability to attenuate the plasma density in the enclosure is reduced.

Figure 8A:
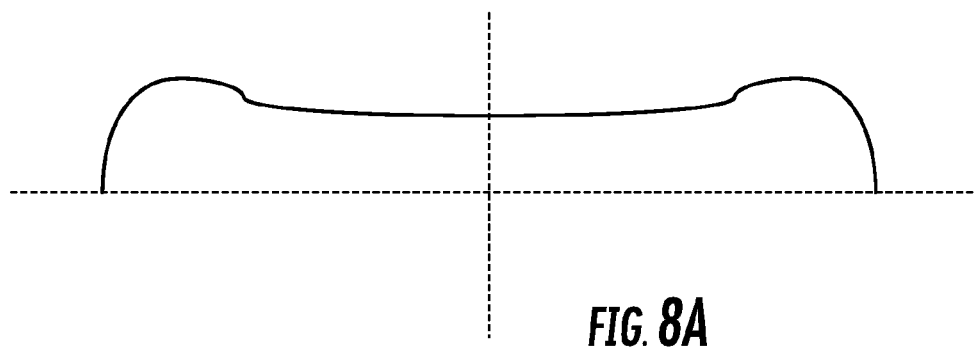
FIG. 8A illustrates a second example of plasma non-uniformity.
Figure 8B:
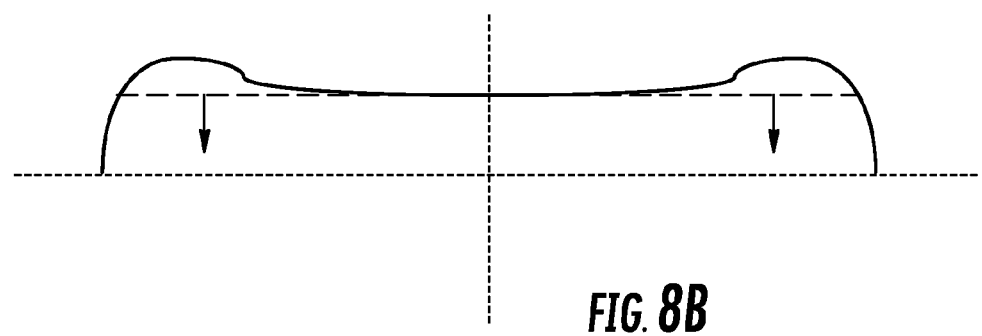
FIG. 8B illustrates the corrective action required for FIG. 8A.

FIG. 8A shows a graph of the plasma density as a function of x-axis position, where the origin indicates the center of the extraction slit 335. As shown in the graph, the plasma density is greatest near the endwalls 338, 340 and decays as one moves toward the center. To correct this, it would be advantageous to reduce the density at the ends, so as to be closer to the rest of the enclosure 302, as shown in FIG. 8B. To achieve this effect, an attenuating material 360 may be placed near the antenna 338 in the region which is to be attenuated. FIG. 8C shows an attenuating material 360 placed over antenna 338 at the ends of the enclosure 302. Note that, like FIG. 7C, the attenuating material 360 covers the antenna 338 in the y dimension, but covers only a portion of each coiled segment 371 in the x dimension.

A similar mechanism may be used for helical antennas, such as that of FIG. 6. For example, if the enclosure of FIG. 6 had a plasma density profile such as that shown in FIG. 7A, the attenuating material 360 may be placed over the center of the enclosure 302, near top surface 339 and bottom surface 341, as shown in FIG. 9A. This figure shows that the attenuating material 360 extends over a portion of the x dimension, but across the entire z dimension. Similarly, if the enclosure 302 of FIG. 6 had a plasma density profile such as that shown in FIG. 8A, the attenuating material 360 may be placed over the sidewalls 338, 340, as shown in FIG. 9B. This figure shows that the attenuating material 360 extends over a portion of the y dimension, but across the entire z dimension.

Figure 10A:
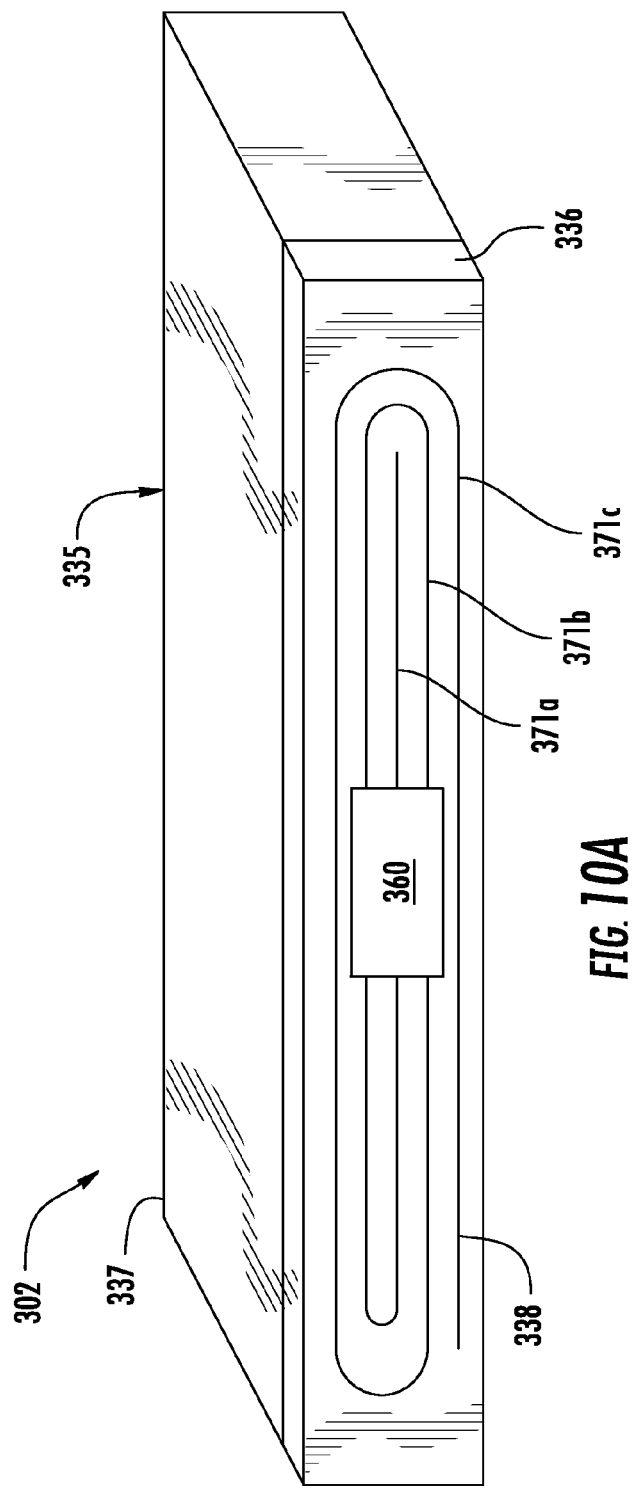
FIG. 10A illustrates a third embodiment to correct the non-uniformity of FIG. 7A.

While FIGS. 7C, 8C, and 9A-B show the attenuating material 360 extending beyond the relevant dimension of the enclosure 302, the disclosure is not limited to this embodiment. In certain embodiments, the attenuating material 360 may extend across only a portion of the relevant dimension. For example, as shown in FIG. 10A, an attenuating material 360 may be placed in proximity to portions of one or more coil segments 371, such that it does not cover any coil segment 371 completely. In addition, there are coil segments that are not covered at all. For example, in FIG. 10A, the outermost coil segment 371c is not covered at all, while the inner coil segments 371a-b are only covered over a small region. In other words, this figure shows that the attenuating material 360 extends over a portion of the x dimension, and a portion of the y dimension.

Figure 10B:
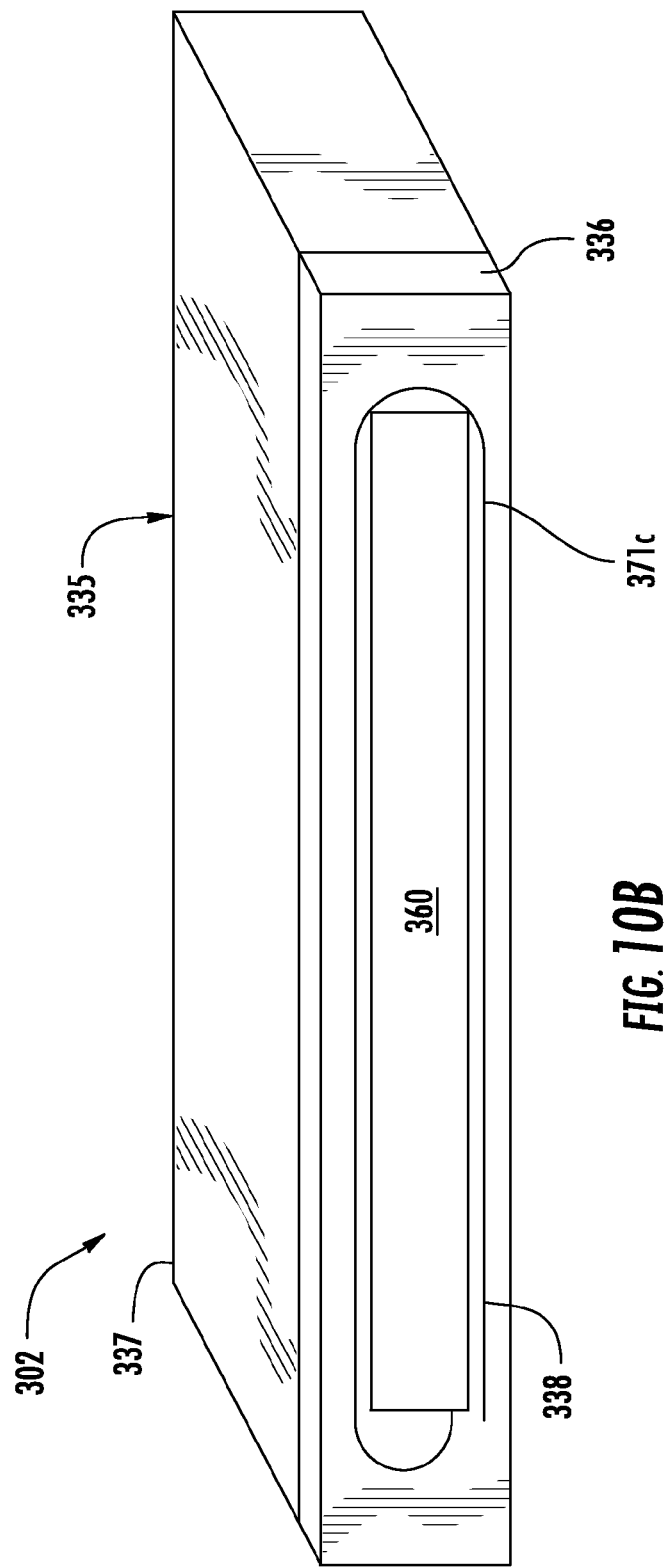
FIG. 10B illustrates a fourth embodiment to correct the non-uniformity of FIG. 7A.

In other embodiments, shown in FIG. 10B, the attenuating material 360, in the form of a ferrite material, is used to completely cover one or more coil segments 371a-b, while leaving other coil segments 371c completely exposed.

FIG. 11 shows another embodiment of a mechanism to allow uniform plasma density. In this embodiment, additional structures 400 are added within the enclosure to selectively reduce the volume of the enclosure 302. For example, the structures of FIG. 10 would attenuate the plasma density in the center of the enclosure, similar to the effect created by FIG. 7C or FIG. 9A. In another embodiment, the structures 400 can be positioned to reduce the volume nears the ends of the ion source 302, thereby creating the same effect as FIG. 8C or FIG. 9B. This material can be of the same type as the interior of enclosure 302, such as aluminum, graphite, alumina ceramic, or silicon carbide.

In some embodiments, the additional structures 400 are placed so as to vary the width or depth of the interior of the enclosure 302. The variation in these dimensions may vary over the length of the enclosure. In other words, as seen in FIG. 11, the effective width of the enclosure 302 is widest near the endwalls 338, 340 and narrowest in the center of the enclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of modifying plasma density within an enclosure, said enclosure having a first side having an extraction slit and having a length, a width and a depth, where length is defined as the dimension parallel to said extraction slit, and width is defined as planar with said first side and perpendicular to length, said method comprising:

disposing an antenna, comprising a plurality of connected coil segments, against a second side of said enclosure to create a plasma within said enclosure; and placing an attenuating material near said antenna, such that said antenna is disposed between said attenuating material and said second wall, such that said attenuating material is sized so as to cover a portion of one dimension of said antenna, such that said attenuating material covers only a portion of each of said plurality of coil segments.

2. The method of claim 1, wherein said antenna comprises a planar antenna, and wherein said second side is disposed opposite said first side.

3. The method of claim 2, wherein said one dimension comprises length.

4. The method of claim 3, wherein said attenuating material is sized to cover said width.

5. The method of claim 3, further comprising moving said attenuating material in a direction perpendicular to a plane of said first side to adjust said plasma density modification caused by said attenuating material.

6. The method of claim 2, wherein said antenna comprises a helical antenna disposed about sides of said enclosure perpendicular to said first side.

7. The method of claim 6, wherein said second side comprises a top or bottom surface having said length and said depth, wherein said one dimension comprises length.

8. The method of claim 7, wherein said attenuating material is sized to cover said depth.

9. The method of claim 8, further comprising moving said attenuating material in a direction parallel to said width to adjust plasma density modification caused by said attenuating material.

10. The method of claim 6, wherein said second side comprises a side wall having said width and said depth, wherein said one dimension comprises width.

11. The method of claim 10, wherein said attenuating material is sized to cover said depth.

12. The method of claim 11, further comprising moving said attenuating material in a direction parallel to said length to adjust plasma density modification caused by said attenuating material.

13. The method of claim 1, wherein said attenuating material comprises a conductor.

14. The method of claim 1, wherein said attenuating material comprises a ferrite.

15. The method of claim 1, wherein said antenna comprises an additional coil segment, said coil segment not covered by said attenuating material.

16. A method of modifying plasma density within an enclosure, said enclosure having a first side having an extraction slit and having a length, a width and a depth, where length is defined as the dimension parallel to said extraction slit, and width is defined as planar with said first side and perpendicular to length, said method comprising:
disposing an antenna, comprising a plurality of connected coil segments, against a second side of said enclosure to create a plasma within said enclosure; and
placing a ferrite near said antenna, such that said antenna is disposed between said ferrite and said second wall, to adjust said plasma density within said enclosure.

17. The method of claim 16, further comprising moving said ferrite in a direction perpendicular to a plane of said second wall to adjust said plasma density modification caused by said ferrite.

18. A method of modifying plasma density within an enclosure, said enclosure having a first side having an extraction slit and having a length, a width and a depth, where length is defined as the dimension parallel to said extraction slit, and width is defined as planar with said first side and perpendicular to length, said method comprising:
disposing an antenna, comprising a plurality of connected coil segments, against a second side to create a plasma within said enclosure; and
adding material to the interior of said enclosure so as to vary the width or depth of said interior of said enclosure along its length.

* * * * *